United States Patent [15] 3,676,755
Glaise [45] July 11, 1972

[54] SEMICONDUCTOR DEVICE AND METHOD OF MANUFACTURING SAID DEVICE

[72] Inventor: Rene Glaise, Caen, France
[73] Assignee: U.S. Philips Corporation, New York, N.Y.

[22] Filed: Feb. 11, 1970
[21] Appl. No.: 10,518

[30] Foreign Application Priority Data
Feb. 13, 1969 France ....6903480

[52] U.S. Cl. ....317/235 R, 317/235 E, 317/235 AB
[51] Int. Cl. ....H01l 13/00
[58] Field of Search....317/235

[56] References Cited

UNITED STATES PATENTS

| | | | |
|---|---|---|---|
| 3,575,646 | 4/1971 | Karcher | 317/235 |
| 3,445,734 | 5/1969 | Pecoraro et al | 317/235 |
| 3,502,951 | 3/1970 | Hunts | 317/235 |

FOREIGN PATENTS OR APPLICATIONS

| | | |
|---|---|---|
| 1,504,781 | 10/1966 | France |

*Primary Examiner*—John W. Huckert
*Assistant Examiner*—E. Wojciechowicz
*Attorney*—Frank R. Trifari

[57] ABSTRACT

A semiconductor device having a semiconductor body comprising a first region of a first conductivity type in the form of a layer adjoining a surface and situated on a second region of the body, a thyristor having four successive zones of alternate conductivity types being provided in the first region.

The device is characterized in that the thyristor is constructed from a first surface zone of the first conductivity type which is fully surrounded within the semiconductor body by a second surface zone of the second conductivity type, a buried zone of the second conductivity type situated below the second surface zone and separated from the second surface zone and from the said second region by the said first region, and a connection zone of the second surface zone and from the said second region by the said first region, and a connection zone of the second conductivity type separated from the second surface zone adjoining the surface which connection zone adjoins the said buried zone.

4 Claims, 14 Drawing Figures

Figure 1:
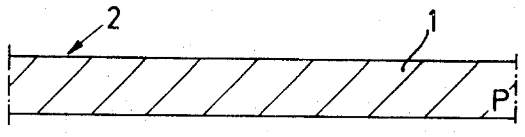
Figure 2:
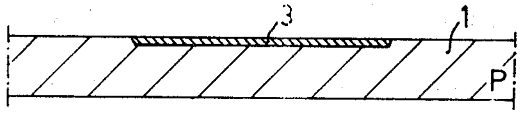
Figure 3:
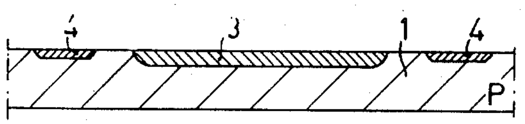
Figure 4:
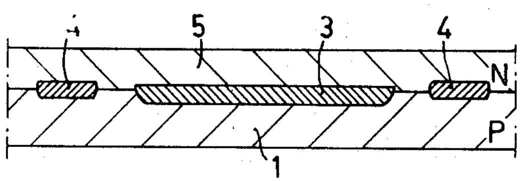
Figure 5:
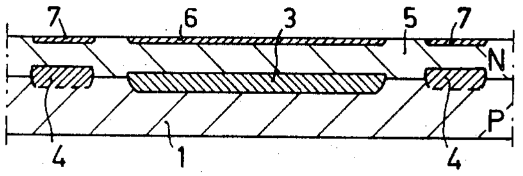

INVENTOR.
RENE GLAISE

BY

[signature]
AGENT

INVENTOR.
RENE GLAISE

BY

AGENT

INVENTOR.
RENE GLAISE

BY

AGENT

SEMICONDUCTOR DEVICE AND METHOD OF MANUFACTURING SAID DEVICE

The invention relates to a semiconductor device having a semiconductor body comprising a first region of a first conductivity type in the form of a layer adjoining a surface and situated on a second region of the body, a thyristor having four successive zones of alternate conductivity types being present in the first region.

The invention furthermore relates to a method of manufacturing the device.

The devices described are used inter alia for switching purposes, because, under the influence of an overvoltage or of a control signal, they can pass from a condition of high impedance into a condition of high conductance. In order to use the rectifying and switching properties of the said devices in integrated circuits, for example, logical circuits, it is necessary to provide said elements simultaneously with the other active or passive elements in the circuit by using known methods, for example, epitaxial growing, diffusion and photolithographic etching methods, in which the connections of the devices thus integrated are preferably provided on the same main surface as that of the other circuit elements.

It is known that, as regards their operation, said devices may be described as an association of two transistors one of which is of the p-n-p type and the other of which is of the n-p-n type and in which the base of one of the transistors is connected to the collector of the other transistor.

A known method of manufacturing such thyristors consists in the simultaneous provision of a p-n-p transistor having a lateral structure and an n-p-n transistor having a vertical structure, in which said transistors have two common zones and, being combined, are equivalent to a thyristor. This construction has several drawbacks. A particular drawback is the important difference between the gain factors of the two said transistors; the said difference in gain factor is the result of this difference in structure.

The gain factor of the lateral transistor is small since the oppositely located lateral surfaces of the p-n junctions form the only active parts of the said junctions. It is known that in order to be able to cause the device to pass into the readily conducting state, the sum of the gain factors $\alpha_1 + \alpha_2$ must be at least equal to 1. When one of the two transistors is of the lateral type, the gain factor of the other transistor must be so much the larger. In addition, the gain factor of a lateral transistor is very sensitive to surface phenomena and the switching characteristics thereby lose in stability and precision. Compared with an equivalent "vertical" transistor, a lateral transistor requires a larger plate surface and moreover the permitted current intensities are comparatively small in view of the small active surfaces of the p-n junctions of the said transistor.

Another method of manufacturing controlled rectifiers having a planar structure with vertical construction of the two composing transistors consists in a succession of diffusions from the same surface and with different depths of diffusion and alternate conductivity types. This method has the drawback of requiring a large number of diffusions; this causes a restriction of the possibilities of choice as regards the doping concentration, the concentration gradient and the diffusion profile and impedes zones having the correct thickness to be obtained in a reproducible manner. Moreover according to this method the central zone which comprises no electrodes, which zone must preferably have a large resistance to obtain sufficiently high switch-over voltages and breakdown voltages, is obtained by a deep diffusion of impurities as a result of which the resistivity of said central zone cannot be equally low and equally readily defined as, for example, in an epitaxially formed layer. On the other hand, one of the outer zones which should have to be strongly doped, is formed by an epitaxial layer or by a substrate having a high resistivity and a weak doping.

One of the objects of the invention is to provide a semiconductor device comprising a thyristor structure in which the above-described drawbacks occurring in known planar structures are avoided or at least reduced considerably.

The invention is inter alia based on the recognition of the fact that by efficaciously using a buried zone, a thyristor structure can be obtained the equivalent p-n-p and n-p-n transistors of which have a vertical structure and have gain factors of the same order of magnitude, while the thyristor can also show comparatively higher cut-off and switch-over voltages and occupies a comparatively small surface area.

The invention is furthermore based on the recognition of the fact that by using two successive epitaxial layers a particularly efficacious method of manufacturing such a structure is possible.

In connection herewith, a semiconductor device of the type mentioned in the preamble according to the invention is characterized in that the thyristor is constructed from a first surface zone of the first conductivity type which is fully surrounded within the semiconductor body by a second surface zone of the second conductivity type, a buried zone of the second conductivity type situated below the second surface zone and separated from the second surface zone and from the said second region by the said first region, and a connection zone of the second conductivity type adjoining the surface and separated from the second surface zone and adjoining the said buried zone.

The two transistors with which the thyristor according to the invention can be assimilated have a vertical structure which permits of giving said transistors gain factors of the same order of magnitude. The surface effects are not predominant either for one nor for the other transistor, and can even be neglected. The diffusions to be performed need not penetrate deeply and the successive operations enable a good control of the geometry, the dopings and the doping gradients.

The first region (the central zone of the thyristor) may be, for example, an epitaxial layer having a low and homogeneous doping as a result of which high breakdown voltages can be obtained. On the other hand, the first surface zone and the buried zone (the outer zone of the thyristor) may be strongly doped and the adjoining p-n junctions may show optimum gradients. The central junction which determines the commutation may be obtained, for example, by one single diffusion in the epitaxial layer. In this manner, the characteristics are better defined than in the cases in which the said junction is obtained by double diffusion; the device is readily reproducible.

According to a first important preferred embodiment a device according to the invention is characterized in that the second region is of the second conductivity type and that the thyristor is provided in an island-shaped part of the first region which is separated from the remaining part of the first region by a surface zone of the second conductivity type which adjoins the second region. The thyristor together with other semiconductor circuit elements which are situated in the same island or in further islands can be incorporated in a monolithic integrated circuit.

The buried zone can be provided at the correct depth in the first region in various manners, for example, by ion inplantation. However, the device advantageously has such a structure that the first region comprises a first epitaxial layer of the first conductivity type which is provided on a second epitaxial layer of the first conductivity type which is situated on the second region, and that the buried zone of the second conductivity type is situated at the area of the separation face between the first and the second epitaxial layer.

Another preferred embodiment is characterized in that at the area of the separation face between the first and the second region a buried layer of the first conductivity type is provided below the buried zone of the second conductivity type, said buried layer of the first conductivity type having a doping concentration which is higher than the doping concentration of the first region. As a result of this buried layer of the first conductivity type, the gain factor of the parasitic transistor which is formed by the buried zone of the second conductivity type, the first region of the first conductivity type, and the second region of the second conductivity type is strongly reduced which decreases the holding current of the thyristor.

The connection zone can be provided beside the second surface zone. Preferably, however, the connection zone is surrounded by the second surface zone and the first surface zone situated therein. As a result of this structure the gain factor of the said parasitic transistor is even further reduced and the active surface of the p-n junction between the second surface zone and the first region is enlarged.

Advantageously, the first region is chosen to be of the n-type and the second region is chosen to be of p-type conductivity while the semiconductor body preferably consists of silicon. For doping the buried layer of the first conductivity type, arsenic may then be used which has a low diffusion constant so that the thickness of the buried layer in the subsequent diffusion steps does not become too large. A further preferred embodiment is therefore characterized according to the invention in that the p-type conductive regions are doped with boron, the buried layer of the first conductivity type is doped with arsenic, and the other n-type regions and zones are doped with phosphorus. The n-type surface zone and the buried p-type zone preferably have doping concentrations lying between $10^{18}$ and $10^{21}$ at/ccm and the n-type conductive first region and the p-type conductive second surface zone have doping concentrations which lie between $10^{16}$ and $10^{18}$ at/ccm, while the p-type conductive second region has a resistivity between 5 and 10 ohm.cm.

The various zones are preferably connected so that at the surface on the first surface zone and on the connection zone, connection conductors associated with the anode and the cathode of the thyristor are provided and on the second surface zone a connection conductor serving as a control electrode is provided.

The invention furthermore relates to a method of manufacturing a device according to the invention as described above which is characterized in that on a substrate of the second conductivity type, the second region, a first layer of the first conductivity type is epitaxially provided, that on said first epitaxial layer a buried zone of the second conductivity type is provided, that on the first epitaxial layer and the buried zone a second layer of the first conductivity type is epitaxially provided, that from the surface in said second epitaxial layer a zone of the second conductivity type, the second surface zone, is diffused, that from the surface in the said second surface zone a zone of the first conductivity type, the first surface zone, is diffused which is entirely surrounded by the second surface zone, that from the surface a connection zone of the second conductivity type separated from the second surface zone is diffused to such a depth that it adjoins the buried zone of the second conductivity type, after which connection conductors are provided on the first and the second surface zone and on the connection zone.

The starting material is advantageously a substrate of the second conductivity type in which, prior to providing the first epitaxial layer, a buried layer of the first conductivity type having a higher doping concentration than the first epitaxial layer is provided below the buried zone of the second conductivity type to be provided.

Figure 10:
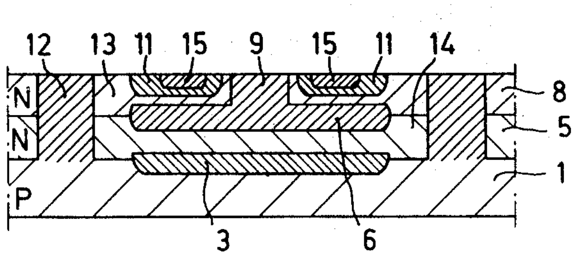
Figure 11:
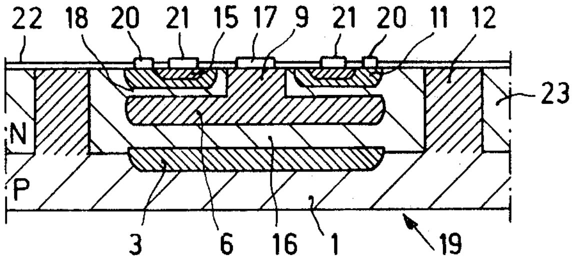
Figure 12:
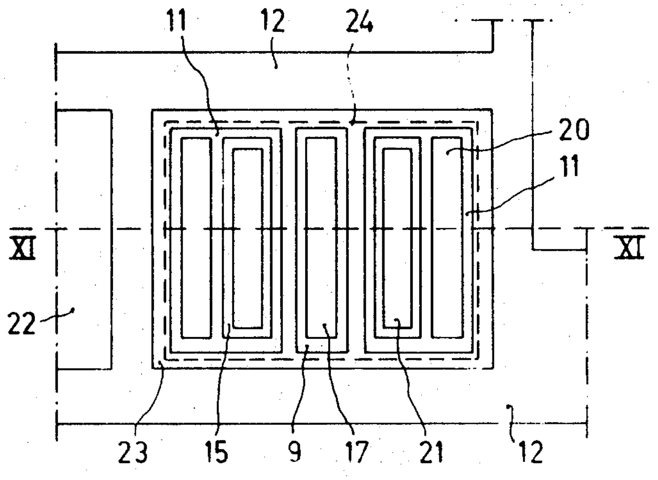

In order that the invention may be readily carried into effect, a few examples thereof will now be described in greater detail, by way of example, with reference to the accompanying drawings, in which FIGS. 1 to 11 are diagrammatic cross-sectional views of a device according to the invention during successive stages of manufacture, while using the method according to the invention, FIG. 12 is a plan view of the device of which FIG. 11 shows a cross-sectional view taken on the line XI—XI.

Figure 13:
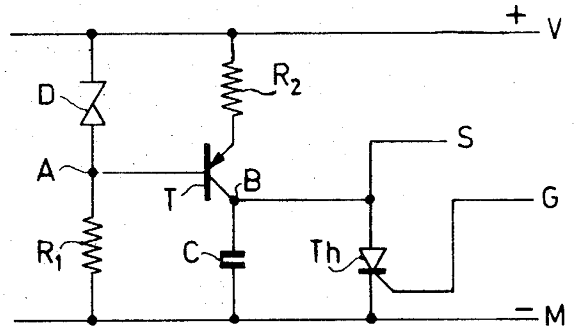
Figure 14:
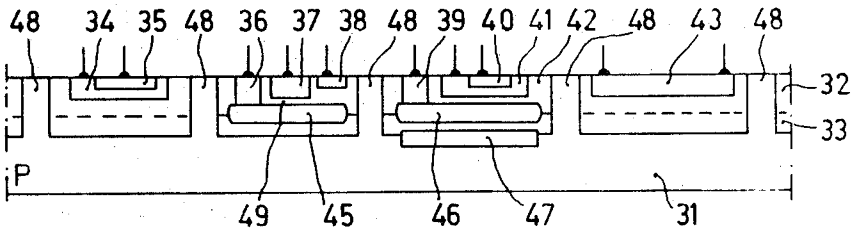

FIG. 13 is a circuit diagram of an integrated circuit having a thyristor structure according to the invention, and FIG. 14 is a diagrammatic cross-sectional view of an integrated circuit according to the diagram shown in FIG. 13.

It is to be noted that the dimensions of the semiconductor devices shown in the Figures are not drawn to scale and particularly the dimensions in the direction of thickness are exaggerated for clarity.

The oxide layers obtained as a result of the various thermal treatments are not shown in the intermediate stages in the drawing.

Starting material is a monocrystalline semiconductor plate, for example, of p-type silicon, which serves as a substrate and is denoted in FIG. 1 by reference numeral 1. In the surface 2 of this plate is diffused an *n+* conductive layer 3 (see FIG. 2) the place and configuration of which correspond approximately to that which is to be given to the anode of the thyristor. The doping material chosen for this diffusion has a diffusion constant which is smaller than that of the doping material used for the other diffusions. The layer 3 is advantageously doped with arsenic.

After this diffusion a *p+* conductive layer 4 (see FIG. 3) is formed on the same surface 2 and corresponds to the variation of the isolation zones which bound the island in which the thyristor is to be provided.

The following operation is the growing of an n-type epitaxial layer 5 (see FIG. 4) with low doping concentration on the surface 2.

A layer 6 (see FIG. 5) of approximately the same shape as the layer 3 is provided by a p-type diffusion on the layer 5 above the layer 3, and a layer 7 of approximately the same shape as the layer 4 is provided above the layer 4.

Figure 6:
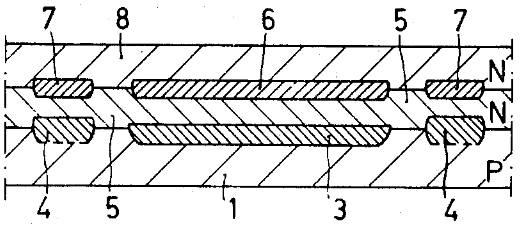
Figure 7:
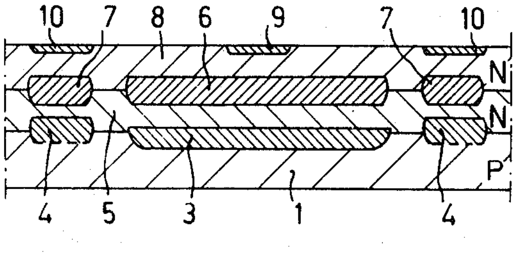
Figure 8:
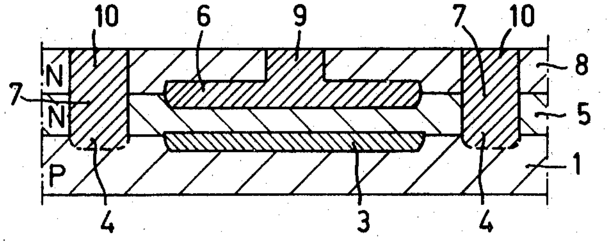
Figure 9:
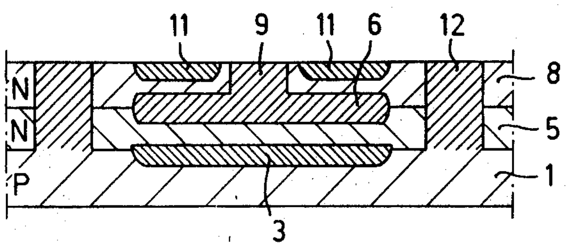

After this prediffusion for the simultaneous formation of the layers 6 and 7, a second n-type epitaxial layer 8 is formed on the surface of the first layer 5 (see FIG. 6).

This second layer may show the same properties as the layer 5, particularly as regards the doping material, the doping concentration and possibly the thickness.

Then a *p+* diffusion is carried on the surface of the second epitaxial layer 8 to form a layer 10 (see FIG. 7) above the layers 4 and 7 and of substantially the same shape as said layers and to form a layer 9 above the buried zone 6 to form a connection zone between the surface and the zone 6.

The diffusion to form the layers 9 and 10 is continued until (see FIG. 8) the zone 9 adjoins the zone 6 and the zones 4, 7 and 10 adjoin each other, so that an isolated n-type island is obtained.

A new p-type diffusion is carried out to obtain the zone 11 (see FIG. 9) which forms a central zone (the second surface zone) of the device and surrounds the zone 9. Of course, this zone 11 contacts neither the zone 9 nor the isolation zones 12.

An n-type zone 15 (see FIG. 10) (the first surface zone) is then diffused in a part of the zone 11, the diffusion depth being smaller than that of the zone 11. The device diagrammatically shown in FIG. 10 is then obtained having a buried p-type outer zone 6 which forms the anode, an n-type central zone which is formed by the parts 13 and 14 of the epitaxial layers 5 and 8, which parts are surrounded by the isolation walls 12, a second p-type central zone 11 (the second surface zone) and an n-type outer zone 15 (the first surface zone) which forms the cathode.

The following operations serve to form contacts on the surface on the zones 6, 11 and 15, the contact with the zone 6 being effected through the zone 9. The metal tracks 17, 20 and 21, respectively, for the zone 9, the zone 11 and the zone 15, respectively, are provided, for example, by vapor-deposition in a vacuum.

The resulting thyristor, the cross-sectional view of which is shown in FIG. 11, may show various configurations in plan view. The zones 11 and 15 and the contacts 20 and 21, for example, may have the form of concentric, circular, oval, polygonal or irregular rings, while the zone 9 and the contact 17 may also be given a circular or a different construction.

FIG. 12 is a plan view of the device of which the cross-sectional view is shown in FIG. 11 taken on the line XI—XI of FIG. 12. The thyristor is accommodated in an island 23 which is bounded by the diffused zones 12 which isolate the thyristor from the circuit elements accommodated in other adjacent islands.

The outer zone 6 and the localized buried layer 3 in this example have the circumference 24 denoted by broken lines;

this circumference corresponds approximately to the outer circumference of the zone 11.

According to an other embodiment, several connection zones 9 are situated in an equally large number of epitaxial layer portions which are surrounded by zones 11. These connection zones, layer portions and zones may also be constructed in the form of combs the teeth of which engage with each other. This construction is known by the name of interdigital configuration.

FIG. 13 is a circuit diagram of a relaxation oscillator comprising a thyristor Th the control electrode of which is passed out at G. The thyristor Th is shunted by a capacitor C which is charged under a constant current intensity via the Zener diode D, the transistor T and the resistors $R_1$ and $R_2$. The output S supplies a sawtooth signal.

The oscillator shown in FIG. 13 can be integrated inclusive of the thyristor Th. In the diagrammatic cross-sectional view shown in FIG. 14 a few circuit elements are shown of such an integrated circuit constructed in a p-type semiconductor plate 31 provided with an n-type epitaxial layer which is formed by the partial layers 32 and 33. The various elements of the circuit are isolated from each other by the diffused walls 48 of the islands in which said elements are situated.

In a first island a Zener diode has been formed with a zone 34 which serves as the anode, and a zone 35 which serves as the cathode, said zones being diffused from the surface of the partial layer 32.

In a second island, a p-n-p transistor has been formed the emitter 37 of which has been diffused from the outer surface of the partial layer 32, the base 49 is formed by a part of said layer 32 having a contact zone 38, and the collector is formed by a buried layer 45 which is diffused from the surface of the partial layer 33 and by a contact zone 36 which is diffused from the outer surface of the partial layer 32.

In a third island a thyristor has been formed which has an outer zone 40 which is diffused from the surface of the layer 32 and which serves as the cathode, a central zone 41 which is diffused from the outer surface of the layer 32 and serves as a control electrode zone, a central zone 42 formed by a part of an epitaxial layer, and a buried outer zone which is diffused from the surface of the layer 33 and serves as an anode and is provided with a contact zone 39. A buried layer 47 of the same conductivity type as the epitaxial layer but having a stronger doping is diffused in the substrate 31 prior to the provision of the layer 33.

A fourth island comprises a diffused resistor 43.

It is obvious that the various above-described circuit elements provided in the same semiconductor plate can simply be manufactured simultaneously, in which the operations which are necessary for their manufacture are the same as those which were described in detail with reference to FIGS. 1 to 11. At the same time, said elements are readily isolated from each other if the correct polarization voltages are supplied to the substrate and to the zones; to the zone 42 and to the zones 48 connected to the substrate 31 are supplied voltages which are such that the junction which separates them is connected in the reverse direction, the thyristor being thus isolated from the rest of the plate. If desirable the same island can comprise several identical or non-identical devices.

Of course it is possible to manufacture other active or passive elements instead of the elements described in this example by operations which are compatable with the method described in detail above.

In manufacturing an integrated circuit of the type shown in FIGS. 13 and 14 it is of advantage to perform the diffusions of the buried layers 45 and 46 simultaneously. The same holds good for the diffusions of the intermediate part of the insulation zones 48. This is the case also for the diffusions carried out to obtain the zones 35, 40 and 38 on the one hand and 34, 37, 43 and 41 on the other hand.

The isolation between the various elements of a circuit constructed in the same plate is obtained in the above-described example by diffusions. Naturally it is also possible to use other insulation methods; for example, grooves which are filled or are not filled by an insulation material or are filled with a conductor may be provided, the groove surfaces being provided with an insulating coating.

As an example are hereinafter stated various stages in manufacturing a device comprising a controlled rectifier which is integrated with other circuit elements, for example, as shown in FIGS. 13 and 14, a semiconductor plate in the manner described with reference to FIGS. 1 to 11.

Starting material is a plate as shown in FIG. 1 manufactured from monocrystalline p-conductive silicon doped with boron. The thickness of the plate is approximately 200 $\mu$ and its resistivity lies between 5 and 10 ohm. cm. This plate may comprise, if desirable, a large number of juxtaposed devices. An $n+$ conductive layer 3 (see FIG. 2) is formed on the surface 2 of the plate. This diffusion is carried out for 10 to 20 hours in such manner that a diffusion depth is reached in the order of 8 $\mu$ in which during the subsequent treatments the arsenic may not diffuse significantly deeper. The concentration lies between $10^{20}$ and $10^{21}$ atoms per ccm.

A p-type layer 4 which corresponds to the isolating walls to be formed is then formed by a boron diffusion. A pre-diffusion with a surface concentration between $10^{19}$ and $10^{20}$ atoms per ccm is carried out which corresponds substantially to the solubility limit.

A first N-type epitaxial layer 5 (see FIG. 4) with phosphorus doping is then formed, the doping concentration being approximately $10^{16}$ atoms per ccm and the layer obtaining a resistivity of 0.5 ohm. cm. while the thickness of the layer is approximately 10 $\mu$.

The p-type zones 6 and 7 are then provided on said first epitaxial layer 5 by a pre-diffusion with boron; these zones 6 and 7 are situated above the layers 3 and 4, while the doping concentration in said zones is of the same order of magnitude, for example, $10^{19}$ atoms per ccm.

Then a second epitaxial layer 8 (see FIG. 6) is formed which has a thickness of approximately 8 $\mu$ and shows the same characteristics as the first epitaxial layer 5.

The zone 10 corresponding to the isolation walls is then diffused in said second epitaxial layer. The concentration which characterizes said pre-diffusion is equal to that used in the preceding boron diffusions. The same treatment simultaneously provides the connection zone 9. These two diffusions are continued until the three successive diffused zones, which together form the isolation walls, meet one another and until the connection zone 9 adjoins the zone 6.

Then two diffusions are carried out: first a boron diffusion for the formation of the thyristor zone denoted by 11 which will be provided with the central contact, the boron concentration being approximately $10^{18}$ at/ccm and the diffusion depth lying between 2 and 4 $\mu$, and then a phosphorus diffusion for the formation of the thyristor zone denoted by 15 which serves as a cathode, the phosphorus concentration lying between $10^{20}$ and $10^{21}$ at/ccm.

The manufacture of the device is completed by forming the anode, cathode, and control contacts. These are obtained, for example, by a metallization carried out in a vacuum. The surface situated opposite to the active surface of the plate is then ground down. The thickness of the plate is reduced to approximately 150 $\mu$ in which, in the case a number of independent integrated circuits are present on the plate, the latter is subjected to the required subdivision treatment. Each plate is welded to an adapted support by means of gold.

The devices obtained according to the described treatment cycle show good voltage and switching characteristics. The breakdown voltage of the junction exceeds 40 volts. The cutoff time is of the order of magnitude of 1 m.sec.

The improvement of the gain factor of the p-n-p-transistor relative to the lateral transistor of the known devices can make the rectifier more sensitive than is sometimes required. The sum of the gain factors of the equivalent transistors may in that case be reduced to approximately 1 when a gold diffusion is used as is known for increasing the number of recombination centers of the charges injected in a device. This diffusion simultaneously improves the switching rate when the device passes to the condition of high impedance.

It will be obvious that the invention is not restricted to the examples described but that many variations are possible to those skilled in the art without departing from the scope of the invention. For example, the thyristor structure according to the invention may be constructed as a discrete element besides as an integrated element in an insulated island. The second region need not be of a conductivity type opposite to that of the first region. The buried zone of the second conductivity type may also be formed differently, for example, by ion implantation, in addition to the described method with two epitaxial layers. Instead of silicon, other semiconductor materials may be used, while instead of silicon oxide other insulating layers, for example, layers of silicon nitride or aluminum oxide, may also be used. The same applies to the metal layers provided on the insulating layer, while the conductivity types may all simultaneously be replaced by their opposite conductivity types.

What we claim is:

1. A planar semiconductor device containing a thyristor, said device comprising a semiconductor substrate, a first epitaxial layer on the semiconductor substrate and a second epitaxial layer on the first epitaxial layer, said first and second epitaxial layers both being of a first conductivity type and the substrate being of a second conductivity type, a first buried layer of the first conductivity type and having a lower resistivity than that of the substrate and of both epitaxial layers and located at the interface between the substrate and the first epitaxial layer, a second buried layer of the second conductivity type and having a lower resistivity than that of both epitaxial layers and located at the interface of the first and second epitaxial layers, a first surface zone of the first conductivity type in the second epitaxial layer and over both buried layers, a second surface zone of the second conductivity type in the second epitaxial layer and fully surrounding the first zone and over both buried layers, a surface connection zone of the second conductivity type extending down to the second buried layer, said second zone being spaced from the second buried layer and its connection zone by a middle region of the first conductivity type of the material of the second epitaxial layer, a surface connection to the first zone and forming one of the thyristor cathode or anode, a surface connection to the second zone and forming the thyristor control electrode, and a surface connection via the connection zone to the second buried layer and forming the other of the thyristor cathode or anode, said first buried layer extending underneath and spaced from the second buried layer in order to reduce the gain of the parasitic transistor formed by the second buried layer, the first epitaxial layer and the substrate.

2, A device as set forth in claim 1 wherein isolation walls of the second conductivity type extend from the surface through both epitaxial layers to the substrate, said isolation walls being spaced from the second surface zone, and both buried layers 3. A device as set forth in claim 1 wherein the first and second zones are annular, and the connection zone is located inside the annular first and second zones.

4. A device as set forth in claim 1 wherein the first surface zone and the second buried layer are P-type with an acceptor concentration between $10^{18}$ and $10^{21}$ at/ccm, the epitaxial layers and the second surface zone have dopant concentrations between $10^{16}$ and $10^{18}$ at/ccm, and the substrate has a resistivity between 5 and 10 ohm – cm.

* * * * *